United States Patent [19]
Gentzler

[11] Patent Number: 6,028,477
[45] Date of Patent: Feb. 22, 2000

[54] ADAPTIVE BIASING IN A POWER AMPLIFIER

[75] Inventor: Charles R. Gentzler, Thousand Oaks, Calif.

[73] Assignee: Powerwave Technologies, Inc., Irvine, Calif.

[21] Appl. No.: 09/057,380

[22] Filed: Apr. 8, 1998

[51] Int. Cl.[7] ........................................ H03F 1/26
[52] U.S. Cl. ................................. 330/149; 330/151
[58] Field of Search ................................ 330/149, 151

[56] References Cited

U.S. PATENT DOCUMENTS

| | | | |
|---|---|---|---|
| 5,166,634 | 11/1992 | Narahashi et al. | 330/151 |
| 5,493,252 | 2/1996 | Takai | 330/52 |
| 5,594,385 | 1/1997 | Anvari | 330/149 |
| 5,789,976 | 8/1998 | Ghannouchi et al. | 330/52 |
| 5,867,064 | 2/1999 | Van Horn et al. | 330/149 |

Primary Examiner—Benny Lee
Assistant Examiner—Henry Choe
Attorney, Agent, or Firm—Fish & Richardson P.C.

[57] ABSTRACT

The invention relates to an amplifier arrangement for amplifying an input signal using a distorting main power amplifier such as one operating as a class AB amplifier. The amplifier can be biased at different operating points. The method and apparatus modify bias control signals to the main amplifier to reduce or minimize the distortion energy added by the main power amplifier. A digitally controlled processor iteratively modifies various control bias signals to adjust the output of the amplifier. Different gain and phase control lines can also be iteratively updated at different rates.

12 Claims, 3 Drawing Sheets

ADAPTIVE BIASING IN A POWER AMPLIFIER

BACKGROUND OF THE INVENTION

The invention relates generally to power amplifiers, and in particular to minimizing distortion in the input/output transfer function for amplifiers, particularly high power class AB power amplifiers.

High power, broad band power amplifiers are well known. These amplifiers may operate in a feed forward configuration, or may have other forms of linearization which are required when the main power amplifier operates, for example, as a class AB amplifier. Although class A amplifiers usually produce less distortion than class AB amplifiers, class A amplifiers are also less efficient than class AB amplifiers. Thus, in order to retain the advantages of efficiency while minimizing distortion, class AB amplifier configurations have been developed which implement various forms of error or distortion correction.

For example, one form of error correction attempts to distort the input signal in a manner which compensates for the distortions of the class AB amplifier. Thus, a predistortion circuit can be provided with various manual adjustments to produce a distortion signal from the original signal, so that when the distortion signal is combined with the input signal, and the combination is input to the power amplifier, operating for example, as a class AB amplifier, the output is substantially a linear amplification of the original input signal to the amplifier arrangement.

Such predistortion circuities typically employ a low power amplifier, preferably having the same general distortion characteristics as the main amplifier, so that its output, properly processed, can be used to obtain the necessary distortion components required to be combined with the input signal to the predistortion circuitry to generate a predistorted input to the main amplifier. Such configurations operate to substantially reduce the intermodulation frequency distortions produced by a class AB amplifier when the variable elements of the predistortion circuitry are properly adjusted.

However, even in properly adjusted amplifier arrangements using predistortion, a certain amount of instability can be observed. For many amplifiers operating in a Class AB mode, the bias point of the amplifier can affect the distortion it produces. Further, in current lateral MOSFET's operating as a class AB amplifier, amplifier component drift can be caused by temperature transients, and if the amplifier characteristics are sensitive to average power input, there can be further amplifier instability. Typically, however, these parameters are relatively slowly varying (for example a typical response time would be on the order of one millisecond); and even a low bandwidth amplifier has a signal bandwidth of one megahertz which corresponds to a period of one microsecond. While these instabilities have been attended to in a feed forward cancellation loop circuitry, for example, they are not adequately handled at the power amplifier itself.

Thus, the invention provides an advantageous approach toward maintaining stability in the input/output relationship of a high power class AB power amplifier arrangement. There results better linear stability over time and lower intermodulation distortions in the amplifier output.

SUMMARY OF THE INVENTION

The invention relates to an amplifier arrangement for amplifying an input signal. The amplifier arrangement features a main amplifier (typically a class AB amplifier), an error loop including a comparator which differences a delayed derivative of the input signal to the amplifier arrangement with a signal representative of the output of the main amplifier to produce an error signal, a first distortion controlled feedback loop including a detector for receiving the error signal and generating a detected error signal output dependent upon the energy in said error signal, and a bias signal generation circuit for generating at least one bias control signal for optimally setting the bias point of the main amplifier. The bias signal generation circuit has a signal correction circuit for receiving the detected error signal output and for generating a bias control signal. The main amplifier is responsive to the bias control signal for changing its operating point for reducing distortion in its output.

In another aspect of the invention, the error loop features an error loop delay circuit connected to receive a signal derived from the input signal to be amplified and an error loop phase and amplitude correction circuit connected in series with the error loop delay circuit, the error loop delay circuit and the error loop phase and gain correction circuits together generating the delayed derivative of the input signal.

The amplifier arrangement further features a detector which, in one embodiment, has an energy measurement circuit for measuring the energy in the error signal and a compensation circuit which has a control processor responsive to the energy measurement circuit for iteratively adjusting the error correction circuitry bias control signal. Preferably, the control processor also operates cyclicly for adjusting a phase correction control circuit and then a gain correction control circuit in the error loop, in a continuously repeating pattern, to reduce the error signal.

The method of the invention relates to minimizing distortion energy in an amplified signal output from a main amplifier (preferable operating as a class AB amplifier) which is part of an amplifier arrangement having an input and an output. The method features the steps of generating an amplifier output signal from the amplifier arrangement; generating an error signal from the output of the main amplifier representing a distortion error energy, and iteratively and successively correcting, using a digitally controlled processor responsive at least to signals derived from the error signal, bias control signals to at least one of the main amplifier and phase and gain adjustments in an error loop.

In various aspects of the invention, the error signal generating step features comparing a signal derived from the output of the main amplifier and a signal derived from the input signal to the amplifier arrangement, generating a difference signal, and then measuring an energy content of a signal derived from the difference signal.

The invention thus advantageously biases, in a dynamic manner, the input bias control signal to a class AB or other distorting main amplifier or active device(s) and thereby causes a substantial minimization of the distortion characteristics of the entire amplifier arrangement. The dynamic character of the system also adjusts for various instabilities including those caused by temperature, signal level, and component drift.

BRIEF DESCRIPTION OF THE DRAWINGS

Other objects, features, and advantages of the invention will be apparent from the following description, taken together with the drawings in which.

DESCRIPTION OF THE PREFERRED EMBODIMENTS

Figure 1:
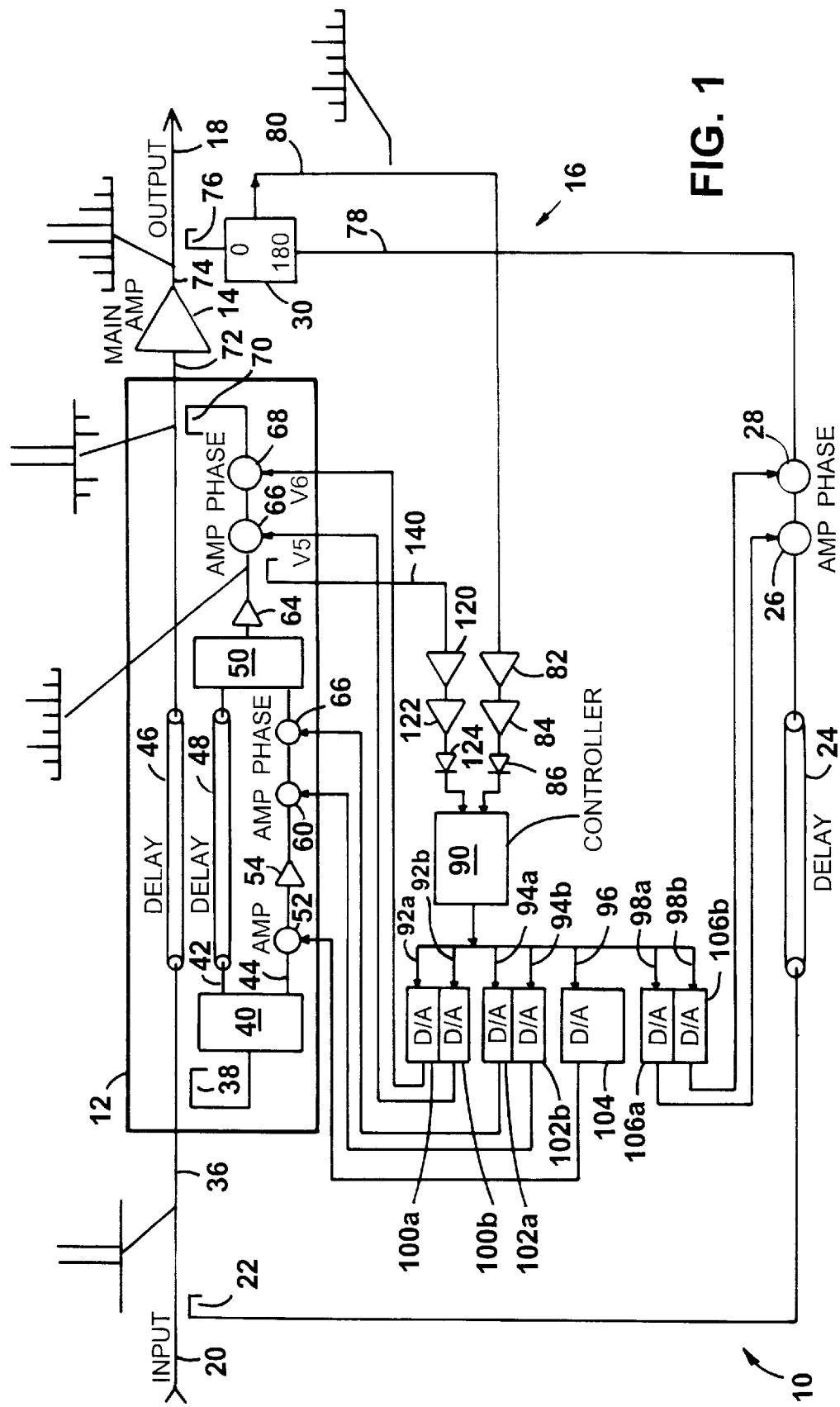
FIG. 1 is a schematic block diagram of an embodiment of the predistorter amplifier and control circuitry illustrating one aspect of distortion minimization in accordance with the invention.

Referring to FIG. 1, an amplifier arrangement 10 has a predistortion circuitry 12, a main power amplifier 14, and a control circuitry 16. Amplifier 14 is typically a high power class AB amplifier whose output over a line 18 can be either used directly, or can be the input to a feed forward distortion cancellation circuitry such as that described in my copending U.S. Application Ser. No. 08/639,264, entitled BROADBAND AMPLIFIER WITH QUADRATURE PILOT SIGNAL, filed Apr. 24, 1997, the contents of which are incorporated herein by reference.

The input to the amplifier arrangement, over a line 20, is split (or sampled) for a number of purposes. First, a line sampling coupler 22 directs part of the input signal to a delay element 24. The output of the delay element is directed to a controlled gain circuitry 26 and from there to a controlled phase circuitry 28. The output of the phase circuitry 28 is passed to a comparison device 30. (The processing order of delay 24, and circuities 26, 28 is not important.)

The remaining input signal over line 36 is sampled by another coupler 38 and the output of coupler 38 is received by a signal splitter 40 which divides the signal equally for output over lines 42 and 44. The remaining input signal from line 36 is directed to a delay element 46.

The output of splitter 40 over line 42 is directed to a delay element 48, the output of which is received by comparison circuitry 50. The other output of splitter 40 over line 44 is received by a gain controlled amplifier 52, the output of which is directed to an auxiliary amplifier 54. The output of amplifier 54 is received by a controlled gain circuitry 60. The output of controlled gain circuitry 60 is delivered to a controlled phase circuitry 62 the output of which is compared with the signal from delay element 48 in comparison circuitry 50. The difference between the two signals, representing distortion components introduced primarily by amplifier 54, is passed through a linear amplifier 64 to a controlled gain circuit 66. The output of the control gain circuit 66 is received by a controlled phase circuit 68. The output of the controlled phase circuit 68 is delivered to a coupler 70 which combines the output of the phase circuit 68 with the output of the delay element 46, to generate an input, over a line 72, to the main power amplifier 14.

The output of the main power amplifier 14, over a line 74, is sampled by a coupler 76 and the sampled output signal is compared (differenced) to the output of the phase controlled circuit 28 available over a line 78, to generate a distortion error signal on a line 80. The distortion error signal over line 80 is amplified using amplifiers 82 and 84, connected in series with each other, and the output of amplifier 84 is detected, here using a Schottky diode 86 to measure the energy in the signal, for input to a digital controller 90. The digital controller 90 outputs, in this illustrated embodiment, seven digital signals over lines 92a, 92b, 94a, 94b, 96, 98a, and 98b to control digital to analog (D/A) converters 100a, 100b, 102a, 102b, 104, 106a, and 106b, respectively. The analog outputs of the digital to analog converters are directed to control the various gain and phase elements of the predistortor circuitry 12 and the feedback control circuitry gain and phase 26 and 28.

The output of the comparison circuit 50, amplified by amplifier 64 to give it a proper signal value for eventual coupling into the output from the delay element 46, is sampled by a coupler 118. The output of the coupler, like the output of comparison circuitry 30, is passed through a pair of amplifiers 120, 122, and is detected at the output of amplifier 122, in the illustrated embodiment of the invention, using a Schottky diode 124, which provides a measure of the energy in the signal output of amplifier 122. That energy value is received by the controller 90 which uses that value to adjust and control the value of the gain at circuits 52 and 60, and the phase correction at circuit 64.

The circuit arrangement 10 thus has three loops in operation. One loop the first distortion loop, includes delay 48, amplifier 52, auxiliary amplifier 54, gain and phase correction circuits 60 and 62, and comparison circuitry 50. The second distortion loop includes those previous elements, and further, linear amplifier 64, and gain and phase correction circuits 66 and 68, along with delay 46. The system error loop includes those previously identified elements plus the main amplifier 14, delay 24, gain and phase correction elements 26 and 28, and comparison circuitry 30. The loops are controlled by the error correction circuitry including the processor 90, the A-to-D's 100a, 100b, 102a, 102b, 104, 106a, and 106b, the amplifiers 82, 84, 120, 122, and the detection elements, here the Schottky diodes, 86 and 124.

The circuit arrangement operates as follows. A sample of the input over line 20 is obtained by coupler 38 and is directed through the voltage variable splitter/attenuator 40 to the linear amplifier 52. The purpose of the linear amplifier is to increase the signal level to drive the auxiliary amplifier 54 which has been designed to produce substantially, to the extent possible, the same magnitude and type of distortion as the main amplifier 14. The output of the distortion auxiliary amplifier is adjusted by gain and phase correction circuits 60 and 62 and then subtracted from the delayed version of the input signal, from delay 48, to cancel the main input signal in the output of the auxiliary amplifier 54 leaving the distortion, at the output of comparator 50. These distortion products are then again amplified, and phase and amplitude corrected, passing through amplifier 64 and then gain and phase correction circuitry 66 and 68. The output of phase correction circuitry 68 is then injected 180° out of phase with the original signal.

The distortion products of a similar nonlinear device (amplifier 54) injected 180° degrees out of phase with the desired signal from delay 46, improves the apparent linearity of the following nonlinear power amplifier 14 operating, for example, as a class AB amplifier. The improvement occurs typically in the third order intermodulation products, and is less for the high order products.

The output of the main amplifier is also sampled by coupler 76. The comparison circuit 30 then compares the sampled output of the main amplifier with the original input signal processed as follows. A sample of the original input signal on line 20 is obtained from coupler 22 and passes through delay line 24. The delay lines 24, 46, and 48 are all selected to maintain the signals in time phase as they are coupled together, taking into account the delays inherent in the amplifier and correction circuities. The delayed output of delay element 24 is phase and gain corrected and delivered to the comparison circuitry 30, the output of which is a measure of the distortion products at the main amplifier output after a null has been obtained. This nulled signal is then used, in part, to control the various elements of the predistortion circuitry 12 and the nulling feed forward circuits 26, 28, to optimize operation at any given power level, temperature, tone spacing, etc.

Referring to the correction and control circuitry 16, the error signal output from comparison circuitry 30 is amplified and isolated by amplifiers 82 and 84, is detected using the Schottky diode 86, in this illustrated embodiment of the invention, and is provided as an input to the processor 90. As noted above, the processor 90 also receives an input from the predistortion circuitry, where the output of the linear amplifier 64, which contains the distortion output from the first distortion loop, is passed through and isolated by amplifiers 120, 122, and detected by Schottky diode 124. In essence, the Schottky diodes measure the energy contained in the signal applied to them and that energy signal is provided to the controller 90 (through analog to digital converters (not shown)).

The controller 90 operates on a priority basis, as described below, and based upon the energy inputs applied to it, and its program priority basis, continuously and iteratively outputs digital signal values to the D to A converters. The D to A converters, upon receiving a new digital signal value, convert their digital inputs to an analog signal output for controlling the various phase and gain elements of the circuitry, that is, the amplifier 52 before the auxiliary amplifier 54, and the gain and phase correction circuits 60, 62, 66, 68, and 26, 28. As these circuits vary in gain and/or phase, the effect is to linearize the input/output relationship from the input signal 20 to the output signal 18 for the entire circuit arrangement. This is performed, as described above, by adding distortion signals (predistorting) to the input of the main amplifier so that the overall response at the output of the main amplifier is linear with respect to the input signal over line 20.

Figure 2:
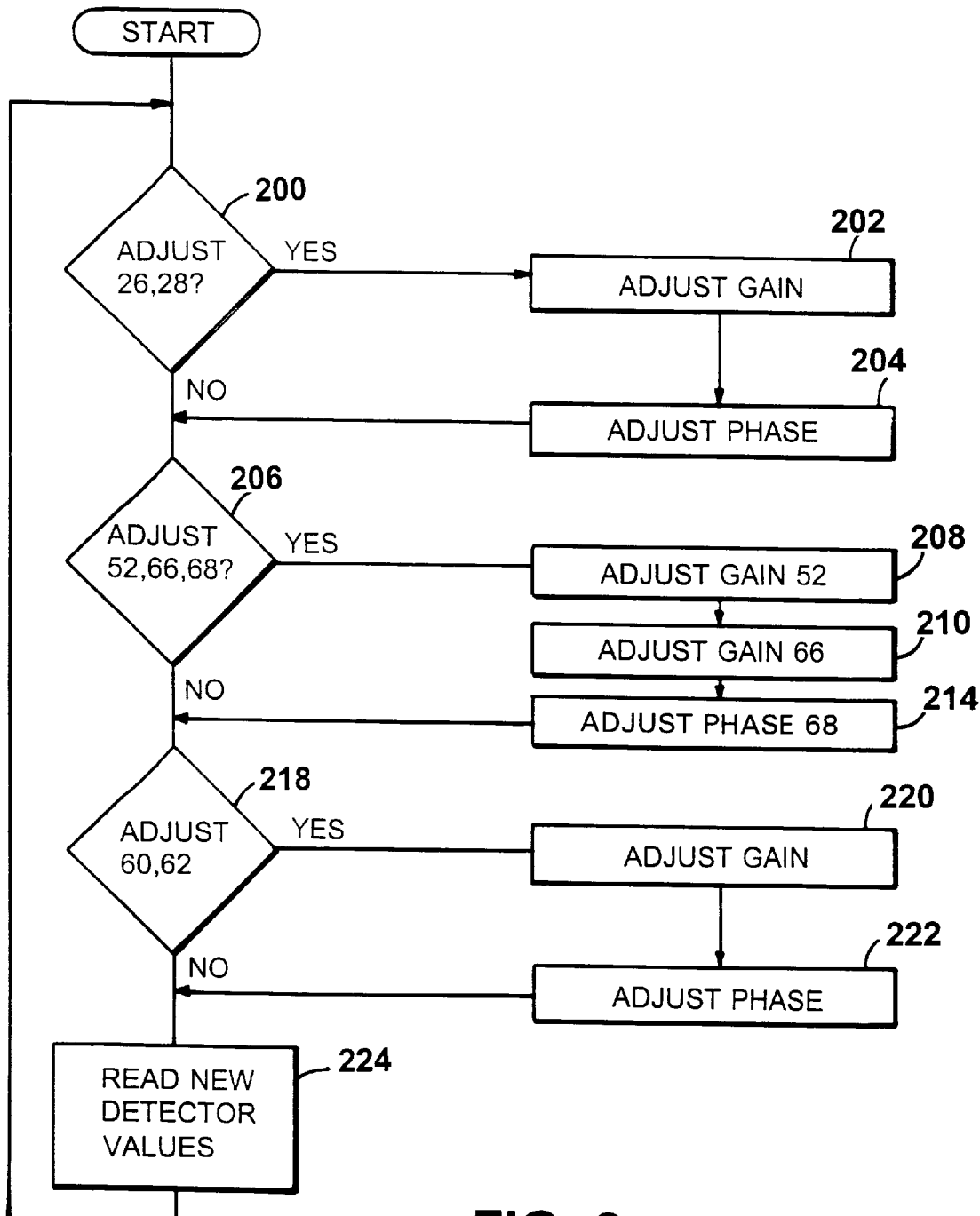
FIG. 2 is a flow chart illustrating operation of the digitally controlled processor in accordance with the invention.

In operation, controller 90 operates substantially in a feedback loop environment. It iteratively adjusts the varying control elements to which it is connected and determines whether the adjustment improves, has no effect, or renders worse, the error products such as the output of the first distortion loop on line 140 or in the error output of the overall device on line 80. The object is to minimize the distortion at the output of linear amplifier 14 upon reaching a null at the output of comparator 30. In performing this process, referring to FIG. 2, the controller operates to give highest priority to the gain and phase control circuits 26, 28, which operate at approximately a millisecond cycle time as opposed to a lower priority in controlling the operation of gain and phase correction circuities 60 and 62 which are updated approximately every three to four milliseconds; and a lowest priority to the adjustment of amplifier 52 and gain and phase correction circuities 66 and 68 which are corrected approximately every 50 milliseconds. The control processor can be for example a model MC68HC11E9 processor manufactured by Motorola.

Accordingly, in operation, controller 90 loops between the various correction circuities in order to continuously maintain and update the correction output values. Thus, once started (referring to FIG. 2) the system first checks whether to adjust gain and phase correction circuits 26, 28. This decision can be based, for example, upon an internal clock measurement so that these elements can be updated every millisecond. This is tested at step 200. If the elements are to be adjusted, then the gain can be adjusted at step 202 and the phase can be adjusted at step 204, after which control returns to the main loop. Thereafter, the system determines whether to adjust the control voltages to gain amplifier 52, gain correction circuit 66, and gain correction circuit 68. If, the decision at step 206 is "yes", the control signals to each of the three elements are adjusted in sequence at steps 208, 210, and 214. Control then again returns to the main loop. Finally, the system checks at 218 whether to adjust the signals controlling gain and phase correction circuits 60 and 62. If the gain and phase are to be adjusted, the system then adjusts, as necessary, those elements at 220 and 222 and control returns to the main loop. The next step reads new detector values at the inputs from detection elements 86 and 124. This is indicated at step 224.

In a particular embodiment of the invention, gain and phase correction circuitries 26 and 28 are adjusted based solely upon the error signal value from detector 86. Similarly, gain element 52 and gain and phase correction circuitries 66 and 68 are also determined based solely on the signal level of detector 86. Finally, the gain and phase correction circuits 60 and 62 are adjusted based solely upon the detector output measurements of detector 124.

Figure 3:
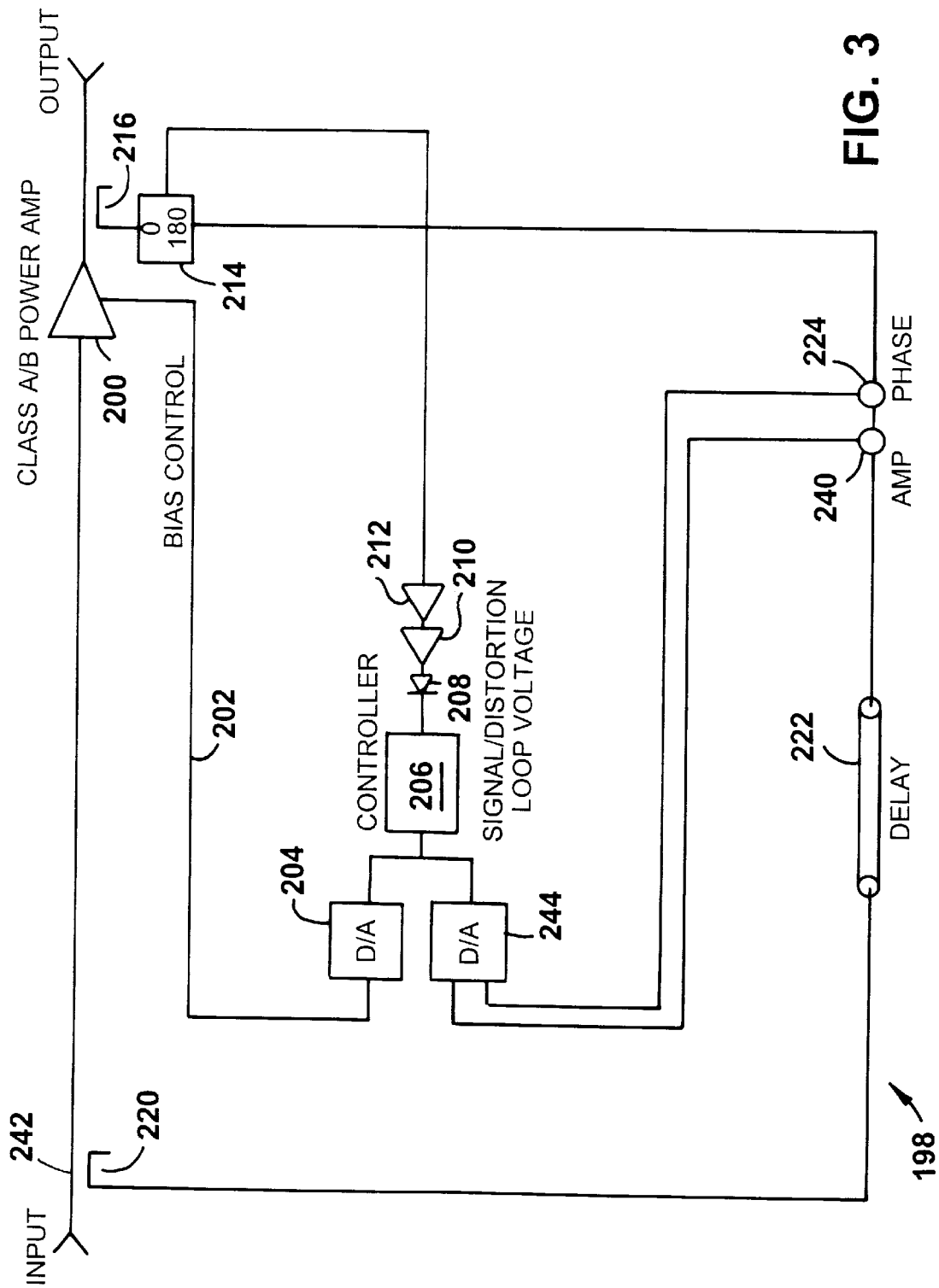
FIG. 3 is a simplified schematic diagram illustrating bias control according to the invention.

Referring now to FIG. 3, a power amplifier circuit 198 in which there is no predistortion, has a main amplifier 200 which is operating in as a Class AB amplifier. The distortion energy output of the amplifier will be affected by the bias point of the amplifier. In a specific example, for example, a lateral MOSFET device can be used as an RF MOSFET transistor amplifier. While this device produces lower source inductance and can operate into the two gigahertz range, in addition to being generally affected by its bias point, this amplifier has associated with it a drift in its operating bias current over long periods of time (for example, hundreds of hours). Accordingly, when these devices are employed over thousands of hours, in a single year, there is concern with regard to the continued operating characteristics of the amplifier.

Accordingly, in connection with the invention, a bias control signal over a line 202 is provided from a digital to analog converter 204. The digital to analog converter is controlled by a controller 206, for example the Motorola controller noted above, which responds to detected energy from a Schottky diode 208 which receives the output of series connected amplifiers 210 and 212. The input to amplifier 212 ideally represents the distortion components in the output of main amplifier 200. Those distortion components are obtained by subtracting, using a comparator 214, a signal derived from the output of the main amplifier using a coupler 216 and a signal derived from the input to the main amplifier, sampled at coupler 220, and passed through a delay 222 and phase and amplitude correction circuitries 224 and 240 respectively.

In accordance with the invention, therefore, the controller operates, iteratively, to periodically adjust the bias to the main amplifier. It then determines whether the distortion energy detected by Schottky diode 208 increases or decreases. In addition, the phase and amplitude circuitries 224 and 240 can be adjusted in the normal manner, as described above, to help improve the characteristics of the out of phase signal being input to comparator 214.

As a result, therefore, the desired output of the amplifier 200 is nulled by the adaptive control of the phase shifter circuitry 224 and variable attenuator 240. The remaining power at the detector is then minimized to minimize the distortion products. Since the optimum bias point for the main amplifier 200 will be dependent upon the power level, the number of tones, tone spacing, etc., in the input signal over line 242, the bias will be initially adaptively adjusted in each mode for the best operating performance and that performance will then continue to be achieved over time as the adaptive circuit continually and iteratively adjusts the control signals to the main amplifier and the circuitries 224 and 240 (in this illustrative embodiment). Thus, in this embodiment, when the main error amplifier signal from coupler 216 is nulled, what remains is the distortion power and therefore what is detected at Schottky diode 208 is the distortion power which can be used to adaptively tune the amplifier, a predistorter as illustrated in FIG. 1, or any other nonlinear device for improved linearity. The continuous bias adjustment to minimize main amplifier output distortion, when the amplifier is a lateral MOSFET also has the desirable effect of compensating for thermal and other drift over time.

The controller 206 thus also controls the digital to analog converters 244, the outputs of which control the phase and amplitude circuitries 224 and 240 respectively.

Additions, subtractions, and other modifications of the described and preferred embodiments of the invention will be apparent to those practiced in this field and are within the scope of the following claims.

What is claimed is:

1. An amplifier arrangement for amplifying an input signal said amplifier arrangement comprising:
    a main amplifier,
    an error loop having
        a comparator which differences a delayed derivative of said input signal to said amplifier arrangement with a signal representative of the output of said main amplifier to provide an error signal;
    a first distortion controlled feedback loop including
        a detector for receiving said error signal and generating a detected error signal output dependent upon the energy in said error signal; and
        a bias signal generation circuit for generating at least one bias signal having
            signal correction circuitry for receiving the detected error signal output for generating a bias control signal, and
    said main amplifier being responsive to said bias control signal for changing its operating point for reducing distortion in its output.

2. The amplifier arrangement of claim 1 wherein said main amplifier is a broadband radio frequency amplifier operating in a class AB mode.

3. The amplifier arrangement of claim 1 further comprising a phase and a gain correction circuitry in said error loop responsive to said signal correction circuitry.

4. The amplifier arrangement of claim 1 further wherein:
    said error loop comprises
        an error loop delay circuit connected to receive a signal derived from said input signal to be amplified, and
        an error loop phase and gain correction circuitry connected in series with said error loop delay circuit and responsive to said signal correction circuitry,
    said error loop delay circuit and said error loop phase and amplitude correcting circuitry together generating said delayed derivative of said input signal.

5. The amplifier arrangement of claim 4 further wherein
    said bias signal generation comprises an energy measurement circuit for measuring the energy in said error signal, and
    said bias signal generation circuit comprises a control processor, responsive to the energy measurement circuit, for iteratively adjusting the signal correction circuitry bias control signal.

6. The amplifier arrangement of claim 5 wherein
    said controller iteratively adjusts said phase correcting circuit, and then said gain correction circuit, in said error loop, in a continuously repeating pattern.

7. The amplifier arrangement of claim 5 wherein said energy measurement circuit is a Schottky diode circuit.

8. The amplifier arrangement of claim 5 further wherein said control processor is responsive for iteratively controlling, at a low priority, said gain and phase control circuitry in said error loop, in response to said error signal detection circuitry.

9. A method of minimizing distortion energy in an amplified signal output from a main amplifier of an amplifier arrangement, said main amplifier being part of the amplifier arrangement and the arrangement having an input and an output, comprising the steps of:
    generating an amplifier output signal from the amplifier arrangement,
    generating an error signal from the output of the main amplifier representing a distortion error energy,
    iteratively and successively correcting, using a digitally controlled processor responsive at least to signals derived from said error signal, bias control signals to at least one of the main amplifier and phase and gain adjustments in an error loop.

10. The method of claim 9 wherein said iteratively correcting step is responsive to distortion error signals generated within said main amplifier.

11. The method of claim 10 wherein said error signal generating step comprises the step of
    comparing a signal derived from the output of the main amplifier and a signal derived from the input signal to the amplifier arrangement for generating a difference signal, and
    measuring an energy content of a signal derived from said difference signal.

12. The method of claim 11 further comprising the step of performing said iterative adjusting and correcting steps at different periodic rates.

* * * * *